US009721057B2

(12) United States Patent
Ganai et al.

(10) Patent No.: US 9,721,057 B2
(45) Date of Patent: Aug. 1, 2017

(54) SYSTEM AND METHOD FOR NETLIST CLOCK DOMAIN CROSSING VERIFICATION

(71) Applicant: Synopsys, Inc., Mountain View, CA (US)

(72) Inventors: Malay Ganai, San Jose, CA (US); Mohamed Shaker Sarwary, San Diego, CA (US); Maher Mneimneh, San Jose, CA (US); Paras Mal Jain, Greater Noida (IN); Mohammad Homayoun Movahed-Ezazi, Saratoga, CA (US); Pronay Kumar Biswas, W. Bengal (IN); Nishant Gupta, Uttarpradesh (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/790,318

(22) Filed: Jul. 2, 2015

(65) Prior Publication Data

US 2016/0259879 A1    Sep. 8, 2016

Related U.S. Application Data

(60) Provisional application No. 62/129,645, filed on Mar. 6, 2015.

(51) Int. Cl.
G06F 17/50    (2006.01)

(52) U.S. Cl.
CPC ...... *G06F 17/5081* (2013.01); *G06F 2217/62* (2013.01)

(58) Field of Classification Search
CPC .......................................... G06F 17/50
USPC .......................................... 716/108
See application file for complete search history.

(56) References Cited

U.S. PATENT DOCUMENTS

| | | | |
|---|---|---|---|
| 7,073,146 B2 | 7/2006 | Sarwary et al. |
| 7,412,678 B2 | 8/2008 | Lahner et al. |
| 7,506,292 B2 | 3/2009 | Sarwary et al. |
| 8,271,918 B2 | 9/2012 | Kwok et al. |
| 8,407,636 B2 | 3/2013 | Iwashita |
| 8,448,111 B2 | 5/2013 | Mneimneh et al. |
| 8,533,541 B2 | 9/2013 | Iwashita |

(Continued)

OTHER PUBLICATIONS

A. Chakraborty et al., "Power Aware CDC Verification at RTL for Faster SoC Verification Closure", http://dvcon-india.org/wp-content/uploads/2014/proceedings/1600-1730/D2A2-2-3-DV_Power_Aware_CDC_Analysis_Paper.pdf, 6 pgs.

(Continued)

*Primary Examiner* — Thuan Do
(74) *Attorney, Agent, or Firm* — Fenwick & West LLP

(57) ABSTRACT

A system and method for netlist clock domain crossing verification leverages RTL clock domain crossing (CDC) verification data and results. The netlist clock domain crossing verification system (NCDC) migrates RTL-level constraints and waivers to the netlist design so that the user does not have to re-enter them. The NCDC checks the netlist and generates a report that compares RTL-level CDC checking results to the netlist-level CDC checking results to make it easy to see new issues. The NCDC receives and stores netlist corrections from user input or automatically corrects certain CDC violations, in the netlist.

18 Claims, 4 Drawing Sheets

(56) References Cited

U.S. PATENT DOCUMENTS

| | | |
|---|---|---|
| 8,607,173 B2 | 12/2013 | Sarwary et al. |
| 8,631,364 B1 | 1/2014 | Dobkin et al. |
| 8,661,383 B1 | 2/2014 | Dobkin et al. |
| 8,661,384 B2 | 2/2014 | Iwashita |
| 8,707,229 B1 | 4/2014 | Dodkin et al. |
| 8,819,599 B2 | 8/2014 | Kwok et al. |
| 8,856,706 B2 | 10/2014 | Mneimneh et al. |
| 2009/0138837 A1* | 5/2009 | Baumgartner ........ G06F 17/504 716/113 |
| 2014/0282321 A1 | 9/2014 | Sarwary et al. |

OTHER PUBLICATIONS

"SpyGlass Products," Synopsys, Inc., 2017, 2 pages, [Online] [Retrieved on Mar. 8, 2017] Retrieved from the Internet<URL:https://www.synopsys.com/verification/static-and-formal-verification/spyglass.html>.

"SpyGlass Lint," Synopsys, Inc., 2017, 2 pages, [Online] [Retrieved on Mar. 8, 2017] Retrieved from the Internet <URL:https://www.synopsys.com/verification/static-and-formal-verification/spyglass/spyglass-lint.html>.

"SpyGlass CDC," Synopsys, Inc., 2017, 2 pages, [Online] [Retrieved on Mar. 8, 2017] Retrieved from the Internet <URL:https://www.synopsys.com/verification/static-and-formal-verification/spyglass/spyglass-cdc.html>.

"SpyGlass RDC," Synopsys, Inc., 2017, 2 pages, [Online] [Retrieved on Mar. 8, 2017] Retrieved from the Internet <URL:https://www.synopsys.com/verification/static-and-formal-verification/spyglass/spyglass-rdc.html>.

"SpyGlass DFT ADV," Synopsys, Inc., 2017, 3 pages, [Online] [Retrieved on Mar. 8, 2017] Retrieved from the Internet <URL:https://www.synopsys.com/verification/static-and-formal-verification/spyglass/spyglass-dft-adv.html>.

"SpyGlass Power," Synopsys, Inc., 2017, 2 pages, [Online] [Retrieved on Mar. 8, 2017] Retrieved from the Internet <URL:https://www.synopsys.com/verification/static-and-formal-verification/spyglass/spyglass-power.html>.

"SpyGlass Constraints," Synopsys, Inc., 2017, 2 pages, [Online] [Retrieved on Mar. 8, 2017] Retrieved from the Internet <URL:https://www.synopsys.com/verification/static-and-formal-verification/spyglass/spyglass-constraints.html>.

\* cited by examiner

SYSTEM AND METHOD FOR NETLIST CLOCK DOMAIN CROSSING VERIFICATION

CROSS-REFERENCE TO RELATED APPLICATION

This application claims priority under 35 U.S.C. 119(e) from U.S. provisional application No. 62/129,645, filed Mar. 6, 2015.

TECHNICAL FIELD

This invention relates to systems and methods for the verification of clock domain crossings in integrated circuit designs, and more particularly for verifying clock domain crossings from a design's netlist.

BACKGROUND ART

Today's system on a chip (SoC) size, timing, and power requirements cannot be met under traditional synchronous clocking methodologies where a single clock controls all memory elements. While controlling an integrated circuit (IC) with multiple clocks helps in meeting those requirements, the asynchronous nature of the clocks brings about new challenges. Signals transmitted asynchronously from one clock domain to another do not have a predictable timing and therefore violate timing requirements that are easily met in synchronous interfaces. Analysis and verification of asynchronous interfaces for correct synchronization mechanisms in such designs have become an essential part of SoC design flows. Neglecting this aspect of verification, often leads to chip failure. This is now handled by a verification step known as clock domain crossing (CDC) verification.

A CDC-based design is a design that has one clock asynchronous to, or has a variable phase relation with, another clock. A CDC signal is a signal latched by a flip-flop (FF) in one clock domain and sampled in another asynchronous clock domain. Transferring signals between asynchronous clock domains may lead to setup or hold timing violations of flip-flops. These violations may cause signals to be meta-stable. Even if synchronizers could eliminate the meta-stability, incorrect use, such as convergence of synchronized signals or improper synchronization protocols, may also result in functional CDC errors. Functional validation of such SoC designs is one of the most complex and expensive tasks.

Within one clock domain, proper static timing analysis (STA) can guarantee that data does not change within clock setup and hold times. When signals pass from one clock domain to another asynchronous domain, there is no way to avoid meta-stability since data can change at any time.

To address clock domain problems due to meta-stability and data sampling issues, electronic chip designers typically employ several types of synchronizers. The most commonly used synchronizer is based on the well-known two-flip-flop circuit. Other types of synchronizers are based on handshaking protocols or FIFOs. In a limited number of cases it may be useful to employ dual-clock FIFO buffers or other mechanisms optimized for domains with similar clock frequencies.

To accurately verify clock domain crossings, both structural and functional CDC analysis should be carried out. Structural clock domain analysis looks for issues like insufficient synchronization, or combinational logic driving flip-flop based synchronizers. Functional clock domain analysis uses assertion-based verification to check the correct usage of synchronizers. SpyGlass® CDC, a product of Assignee is an example of an electronic design automation (EDA) tool for CDC verification.

Electronic chip designers check for CDC problems by running CDC checks while they develop the register-transfer-level (RTL) design. The designers specify CDC constraints identifying clock signals and parameters specifying clock frequency, clock-phase and clock source. The constraints also specify blocks and path to include or exclude from checking. The designers also create a waivers file that tells the CDC checker to ignore the specified issues.

Netlist level CDC verification is essential because transformations induced by timing-driven synthesis optimizations, as well as test-driven and power optimization-driven netlist modifications of the clock structures introduce new CDC issues. After RTL development, designers use an RTL compiler to flatten and optimize the logic and generate the netlist design. At the netlist level designers typically add design-for-test (DFT) features such as scan chains that can be used for chip connectivity testing and debugging. At this stage of the development cycle the designers are usually under pressure to complete the design quickly. The designers want to check for CDC issues quickly but CDC checking the netlist is currently a difficult time-consuming task. The netlist has different net names than the RTL design. The designer has to formulate new CDC constraints that refer to the net names in the netlist. Well-defined structures like multiplexors used to select between clocks may be difficult to identify in the netlist. Due to the application of CDC at different hierarchy levels in RTL and netlist, the constraints at RTL blocks may not be mapped independently of each other in the netlist. For example, clock constraints corresponding to two different RTL blocks may correspond to fanouts of the same clock at a higher hierarchy level. Thus, the netlist may have additional clock domain crossings not present in the RTL, may have clock domain crossings that don't map to RTL, and may have crossings that have become unsynchronized.

Electronic chip designers need an electronic design tool to help them CDC check a netlist quickly and easily.

SUMMARY DISCLOSURE

A system and method for netlist clock domain crossing (NCDC) verification leverages the corresponding RTL clock domain crossing (CDC) verification data and results by migrating RTL-level constraints and waivers to the netlist design so that the user does not have to re-enter them. The RTL to netlist migration of CDC constraints is can be performed by identifying and mapping the RTL signal names to the corresponding netlist signal names. The NCDC system then checks the netlist using the migrated constraints in the CDC verification to identify correspondences between RTL and netlist level crossings. The system compares RTL-level CDC checking results to the netlist-level CDC checking results, generating a report highlighting similarities and differences in the CDC results on the above crossings that makes it easy to see new issues.

In particular, an automated method for performing clock domain crossing (CDC) verification of a netlist corresponding to a register-transfer-level (RTL) design of an integrated circuit is implemented as design verification software running on a computer system. The system comprises a computer processor having access to data storage storing design verification software that, when executed by the computer processor, is operative to carry out the steps of the method.

First, the data storage receives (a) a register-transfer-level (RTL) design of an integrated circuit, together with specified RTL-level CDC constraints, (b) RTL CDC verification results, and (c) a netlist corresponding to the RTL design. The received RTL-level CDC constraints can be those that were previously provided by a user for sign-off on the RTL CDC verification results.

The processor then migrates the RTL-level CDC constraints to netlist CDC constraints and stores the migrated netlist CDC constraints in the data storage. Migrating of the RTL-level CDC constraints to netlist CDC constraints includes identifying and mapping RTL signal names in the received RTL design to corresponding netlist signal names in the received netlist, and may involve applying one or more of (a) change names rules, and bus naming styles used during synthesis of the netlist from the RTL design, and (b) a logic equivalence checking (LEC) mapping file generated during equivalence checking between the RTL design and netlist. Specified netlist constraints can be promoted from a lower design hierarchy level to a higher design hierarchy level based on hierarchy in the received RTL design.

Next, the processor checks the received netlist for asynchronous clock domain crossings using the migrated netlist CDC constraints to identify correspondences between RTL and netlist level crossings and reports any CDC violations found in the netlist. Checking the received netlist may comprise any one or more of: using the migrated constraints to identify synchronized crossings at the netlist; identifying any additional CDC crossings at the netlist due to lockup latches; and identifying any glitch violations due to one or more source transitions that are allowed by the netlist CDC constraints, wherein glitch violations can be identified using Kung's algebra.

The processor compares netlist CDC verification results with the received RTL CDC verification results, and reports specified kinds of similarities and differences. For example, similarities may be reported whenever (1) source and destination of respective crossings are matched exactly in the netlist and RTL design, (2) violation status is the same, and (3) the respective crossings are either both synchronized or both unsynchronized. Likewise, differences may be reported whenever one or more of (1) source and destination of respective crossings do not match exactly in the netlist and RTL design, or (2) respective crossings do match exactly but violation status is different, or (3) respective crossings match exactly but said crossings are neither both synchronized nor both unsynchronized.

The NCDC system may receive from a user and store netlist modifications correcting reported CDC violations. Alternatively, the system processor could also automatically make certain of those corrections itself based, for example, on the reported differences between the RTL and netlist CDC verification results.

DETAILED DESCRIPTION

The netlist design clock domain crossing checker (NCDC) checks a netlist design by leveraging RTL CDC data and results. The NCDC generates typical CDC checking results such as identifying CDC paths and identifying possible CDC failures because of incorrect synchronization logic. In addition, the NCDC generates a report comparing netlist CDC results to RTL CDC results so that an electronic chip designer can quickly see what is different. The NCDC also reports how the RTL CDC constraints and waivers map to netlist CDC constraints. The NCDC has additional CDC checks which include recognizing design-for-test (DFT) features such as lock-up latches, and glitch checks for logic hazards. The NCDC automatically corrects certain types of CDC violations pre-specified by a user.

The NCDC reads the netlist design to be checked and the RTL CDC data and results. The RTL CDC data includes CDC constraints and CDC waivers. The NCDC migrates the RTL CDC constraints and RTL CDC waivers to the netlist level and shows the migration results to the designer. The NCDC may not be able to map all of the RTL CDC constraints and waivers. In one embodiment the designer has the option to modify the CDC constraints and waivers before continuing to check the netlist design. The NCDC migrates constraints and waivers by applying multiple signal mapping heuristics. Signal mapping heuristics include uses logical equivalence checks and using signal-name-change rules. In one embodiment the NCDC reads a migration guide file containing signal-name-change rules. After migrating RTL constraints and waivers, the NCDC checks the netlist design, reports issues and compares the netlist CDC results to the RTL CDC results.

Figure 1:
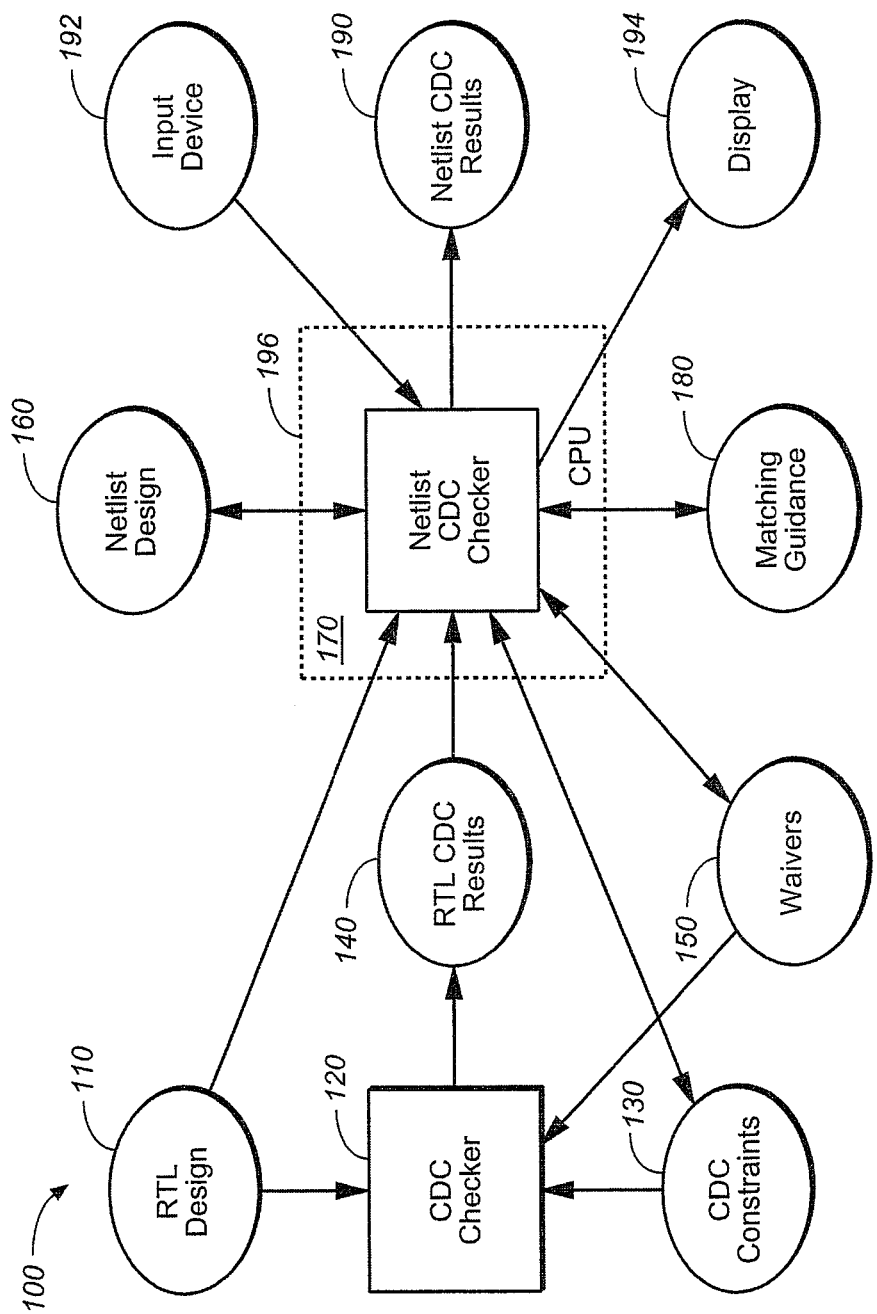
FIG. 1 shows a system for verifying clock domain crossings at the RTL design level and a system for verifying clock domain crossings at the netlist design level.

FIG. 1 is an exemplary and non-limiting diagram 100 shows a system for verifying clock domain crossings at the RTL design level and a system for verifying clock domain crossings at the netlist design level. A designer runs the CDC checker 120 to check the RTL design 110. The CDC checker 120 reads the RTL design 110 and designer-specified CDC constraints 130. The RTL design 110 is typically written in a behavioral design language such as Verilog or VHDL. The CDC constraints are typically written in a constraints language such as Spyglass® Design Constraint (SGDC) or Synopsys Design Constraint (SDC). The CDC checker 120 checks the design and produces RTL CDC Results 140. The designer looks at the RTL CDC Results 140, modifies the RTL design 110 and CDC constraints 130 as needed and creates a waivers file 150 listing CDC issues to ignore. The designer runs the CDC checker 120 multiple times until he or she is satisfied with the result.

After completing RTL development the designer generates a netlist design 160. The designer modifies the netlist for issues such as DFT and power optimization. The designer runs the netlist CDC checker (NCDC) 170 to check the netlist design 160. The NCDC 170 reads the netlist design 160, the RTL design 110, the CDC constraints 130, the RTL CDC results 140, the waivers file 150 and a matching guidance file 180. The matching guidance file 180 has rules that assists the NDC is matching RTL signal names to netlist signal names. The NDC 170 generates netlist CDC results 190. The netlist CDC results include constraint and waiver migration results, a list of CDC crossings, CDC crossing issues and a comparison with the RTL CDC results.

The following statements give examples of constraint and waiver migration results:
    #fst2slow/clkFast--->fst2slow/clkFast
    #fileName: constraint.sgdc Linenumber: 2
    clock-name fst2slow/clkFast-period 10
    #fst2slow/clkSlow--->fst2slow/clkSlow
    #fileName: constraint.sgdc Linenumber: 3
    clock-name fst2slow/clkSlow-period 30
    #fst2Slow/X/S------->fst2Slow/dest3
    #fst2slow/clkSlow--->fst2slow/clkSlow
    #fst2slow/clkFast--->fst2slow/clkFast
    #fileName: constraint.sgdc Linenumber: 4
    qualifier-name fst2slow/dest3-from clk
    fst2slow/clkFast-to_clk fst2slow/clkSlow
    -type des-crossing
    #fst2slow/clkSlow--->fst2slow/clkSlow
    #fst2slow/clkFast--->fst2slow/clkFast
    #fst2slow/src------>Not migrated
    #fst2slow/dest1[1]--->fst2slow/dest1_1
    #fileName: spyglass.swl Linenumber: 12
    waiver-rule "Ac_cdc01a"-msg
    "Fast('fst2slow/clkFast') to
    slow('fst2slow/clkSlow') clock crossing(from
    'fst2slow/src(?)' to 'fst2slow/dest1_1') detected.
    Data hold check: FAILED"
    -comment "Created by xyz on 9-Jan-2015 14:12:19"

The first statement specifies that the RTL signal fst2slow/clkFast has the same name in the netlist. The third statement specifies the waveform for the clock fst2slow/clkFast. The seventh statement specifies that the RTL signal fst2Slow/X/S is renamed fst2Slow/dest3 in the netlist. The RTL signal fst2slow/src cannot be migrated to the netlist. The qualifier statement specifies a clock-domain crossing. The waiver statement specifies a CDC issue to be ignored. The waiver statement has a problem because it refers to the unmigrated signal fst2slow/src.

The following table gives an example report, part of the netlist CDC results 190, highlighting the difference between RTL and netlist CDC results:

| Crossing | RTL/ netlist | Sync/ Unsync | Masked/ unmasked | Rule violation | Rule pass | Rule waived | RTL/Netlist Specific Violation |
|---|---|---|---|---|---|---|---|
| [src1, dest1] | RTL | Sync | Unmasked | | Ac_glitch03 | | |
| [src1, dest1] | Netlist | Unsync | Unmasked | Ac_glitch03 | | | Yes |
| [src2, dest2] | RTL | Sync | Unmasked | | | Ac_glitch03 | |
| [src2, dest2] | Netlist | Unsync | Unmasked | | | Ac_glitch03 | No |
| [src3, dest3] | RTL | UnSync | Masked | | Ac_glitch02 Ac_conv02 | | |
| [src3, dest3] | Netlist | Unsync | Masked | Ac_glitch02 | Ac_conv02 | | Yes |

The above table lists CDC crossings in column 1. Column 2 indicated whether the row applies to the RTL or the netlist. Column 3 indicates if the CDC crossing is synchronous or asynchronous. Columns 4 to 7 indicates if a rule has passed, failed, been waived or masked. The last column allows a designer to quickly spot violations that only occur in the netlist CDC checking or only occur in the RTL CDC checking.

The matching guidance file 180 contains mappings from RTL to netlist and naming rules as follows:
    design_map_info-match_point_rtl
    "des3/key_b_r_reg[0]"-match_point_gate
    "des3/key_b_r_reg[0][0]"
    set bus_naming_style %s_%d_

A designer creates the design-map-info constraints in the matching guidance file by running a script on a logic equivalence check (LEC) mapping file. Since LEC mapping files typically contains outputs of sequential elements and primary inputs (PI), the mapping of internal RTL signals is performed using several heuristics. The NCDC also relies on a "bus_naming_style" parameter which explains how a RTL bus net is to be mapped to a netlist name. In the absence of a LEC file, the NCDC may also use the naming style to find possible RTL mappings. The example set bus_naming_style parameter above indicates that a RTL net, say des/a/data[3] will be mapped to des/a/data_3_ in the netlist.

The NCDC 170 runs as an application program on a central processing unit (CPU) 196. The NCDC 170 interacts with a designer through an input device, 192 and a display, 194. The NCDC 170 displays progress and results on the display, 194. The RTL design 110, the CDC constraints 130, the RTL CDC Results 140, the waivers file 150, the netlist design 160, and the matching guidance file 180 are all stored as data files on a computer storage device.

In one embodiment of the invention the NCDC works interactively with the designer. The designer views and corrects constraint and migration issues interactively. The designer can request information about specific CDC crossings and can view related information and related constraints, wavers and parts of the design.

In one embodiment the NCDC updates the CDC constraints 130, the waivers file 150, and the matching guidance file 180. In a second embodiment the NCDC 170 creates new files containing the updated CDC constraints 130, waivers 150, and matching guidance 180. In a third embodiment the NCDC 170 automatically corrects certain types of CDC violations pre-specified by a user. The NCDC 170 updates the netlist design 160. A user specifies that the NCDC 170 should automatically add synchronizers to the design to correct CDC violations. A user may specify that the NCDC 170 should only add synchronizers under specific conditions—such as when a CDC problem is reported at the netlist level but not at the RTL level.

Figure 2:
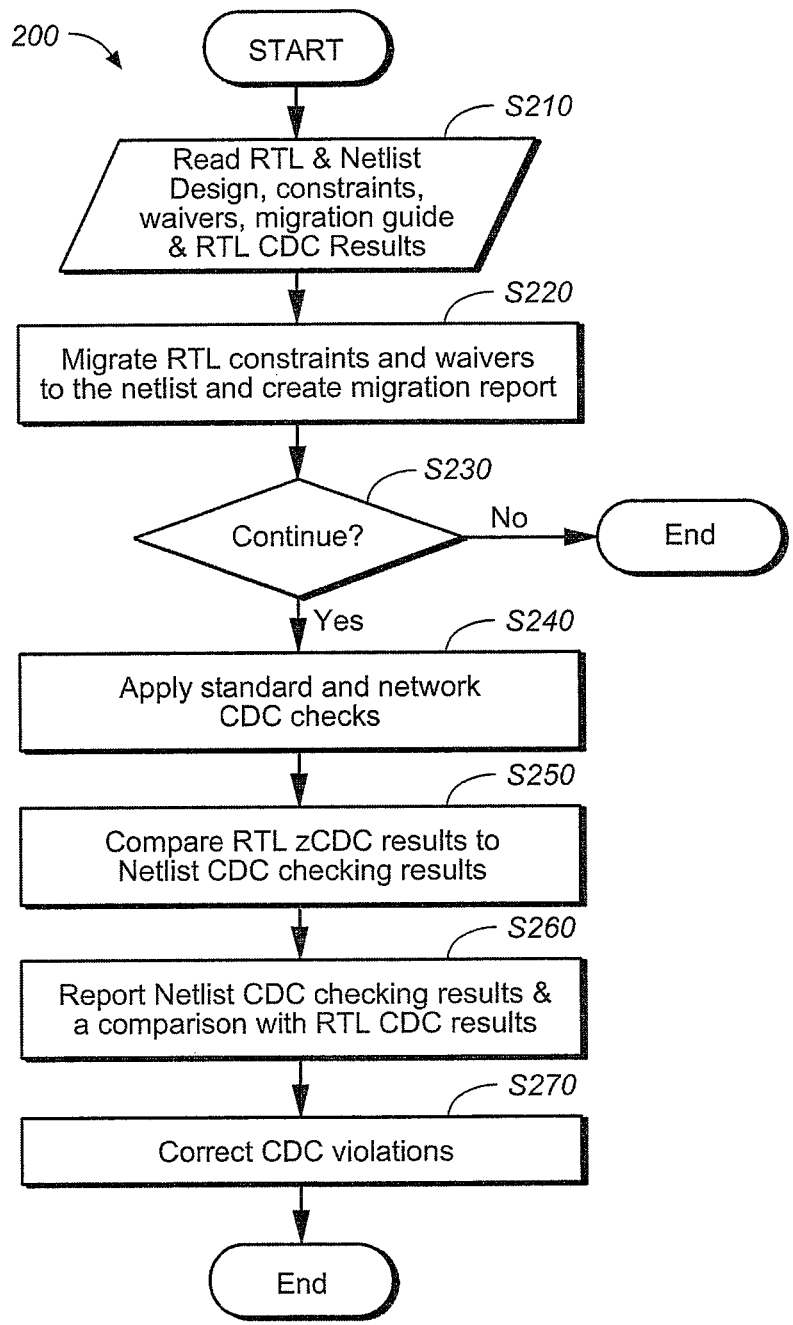
FIG. 2 shows a flowchart outlining the steps for verifying clock domain crossings of a netlist design.

FIG. 2 is an exemplary and non-limiting flowchart 200 for CDC checking a netlist design. In S210 the NCDC reads the RTL & netlist designs, the constraints, the waivers, the migration guide & the RTL CDC Results. In S220 the NCDC migrates the constraints and waivers generating a migration report. The NCDC looks for a mapping from the RTL signal name to the netlist signal name. The NCDC checks if the matching guidance file has an entry for the RTL signal name. The NCDC checks if the netlist has an identical signal to that in the RTL. The NCDC checks if the given RTL name is hierarchical, and if there is a prefix match in the netlist. If so, the NCDC checks if the netlist name and RTL name correspond to the same net with a suffix of wire/buffer/inverter. If the RTL signal name has a wild-card character the NCDC obtains a list of all RTL names, and tries to map them using the previously mentioned methods. So far, the migrated constraints are for the same hierarchical level as RTL. However, if the netlist is at a higher hierarchical level than RTL, the NCDC promotes the migrated constraints to maintain the correct hierarchical relationship between the constraints. For example, clocks constraints corresponding to two different RTL blocks may correspond to fanouts of the same clock in the netlist (at a higher hierarchy level). In that case, the promotion will ensure the equality among the corresponding clocks.

In S230 the NCDC decides whether to continue on to the next step of checking at S240 or to exit. In one embodiment the NCDC presents the migration report to the designer and ask the designer whether it should continue. In a second embodiment the NCDC decides whether to continue based on the number of un-migrated signals and a threshold pre-specified by the designer.

In S240 the NCDC applies standard CDC checks including glitch checks. The NCDC identifies all clock domain crossings, determines if they are synchronous or asynchronous and applies a number of CDC checks. The NCDC will not apply the checks to paths that have been excluded by exclusion constraints.

In S250 the NCDC compares the RTL CDC results to the netlist CDC results and in S260 the NCDC produces a report comparing the two sets of results. The comparison report highlights issues that only appear in the RTL CDC check or only appear in the netlist CDC check. In S270 the NCDC corrects certain types of CDC violations pre-specified by a user. In one embodiment the NCDC updates the design automatically, for example by adding synchronizers, to correct certain types of CDC violations pre-specified by a user. In a second embodiment the NCDC interacts with a user with the NCDC recommending possible netlist changes to correct an identified problem then receiving and storing any such changes from the user input.

Figure 3:
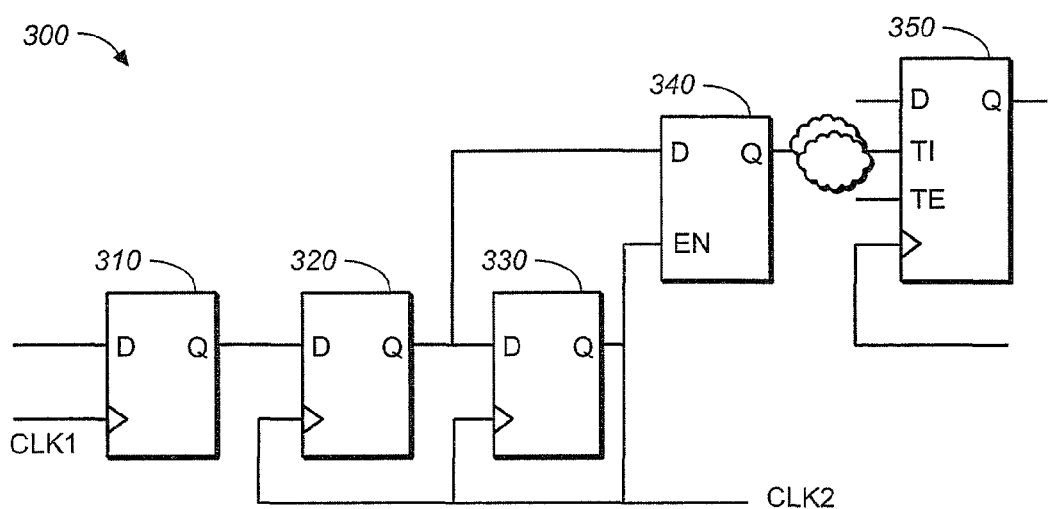
FIG. 3 shows a lockup latch that is typically added to the netlist design.

FIG. 3 shows logic schematic 300 with a lockup latch 340. Register 310 is driven by clock signal CLK1. Register 310 drives register 320 driven by clock signal CLK2 crossing a clock domain boundary. Registers 320 and 330 provide synchronization logic between the two clock domains. Register 340 is a lock-up latch added for DFT. Normal CDC checking would indicate an asynchronous clock domain crossing as unsynchronized due to the presence of lock-up latch 340. The lock-up latch 340 is only used during testing and should not affect synchronization. The NCDC recognizes lock-up latches and does not report the crossing as unsynchronized.

Figure 4:
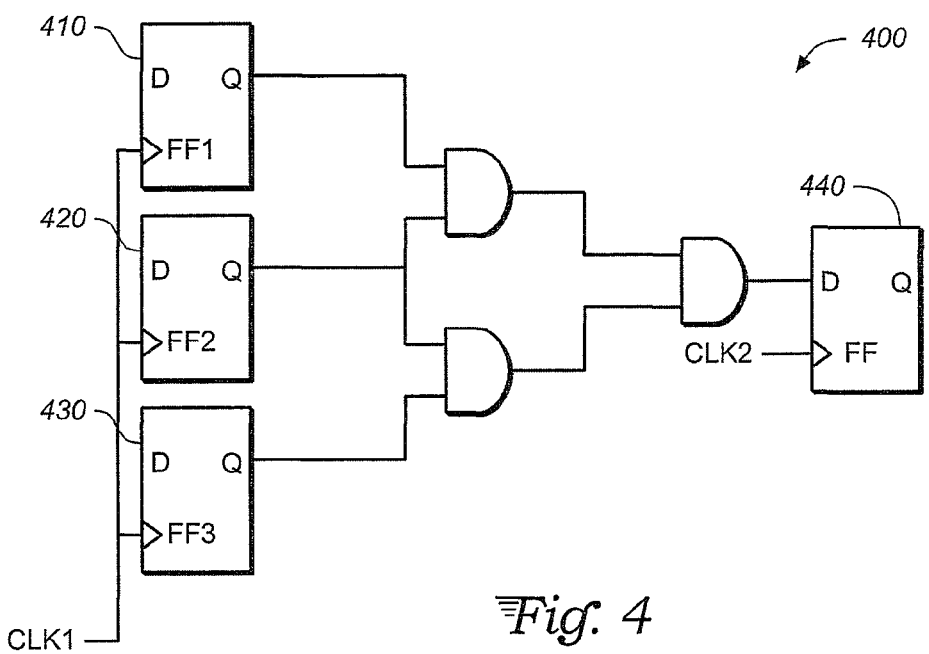
FIG. 4 shows signal reconvergence which can sometimes cause a glitch.

FIG. 4 shows logic schematic 400 with three registers 410, 420 and 430 within one clock domain driving combinational logic that drives register 440 within a different clock domain. Glitches are a cause for concern in signals crossing clock domains. Typically, any combinational logic may be subject to short-lived glitches. These issues are generally harmless for synchronous transfers because they resolve themselves when you activate the next clock edge. For asynchronous transfers the design may receive a glitch as a pulse at a clock or data pin, causing a functional failure. For this reason, it is important to take care using any combinational logic that may cause glitches on a CDC path. If registers 410, 420 and 430 represent a gray-code counter then only one of the registers will change value at a time and a glitch will be avoided.

In general, glitches for a 2-input AND gate can be avoided when (a) all inputs are either static or rising, or (b) all inputs are either static or falling. The following hazard-logic table describes the possible input and output states for a 2-input AND gate:

|    | S0 | S1 | R  | F  | H  |
|----|----|----|----|----|----|
| S0 | S0 | S0 | S0 | S0 | S0 |
| S1 | S0 | S1 | R  | F  | H  |
| R  | S0 | R  | R  | H  | H  |
| F  | S0 | F  | H  | F  | H  |
| H  | S0 | H  | H  | H  | H  |

The row headings represent the state of the first input to the AND gate. The column headings represent the state of the second input to the AND gate. The intersection of row and column give the output state corresponding to the two input states. S0 means a static value of 0, and S1 means a static value of 1. R means a rising value, i.e., a transition from 0 to 1 and F means a falling value, i.e., a transition from 1 to 0. H means a logic hazard, also known as a glitch (0-1-0 or 1-0-1).

The NCDC uses hazard-logic tables to detect possible glitches. The NCDC checks transitions that are allowed by user-provided constraints.

Figure 5:
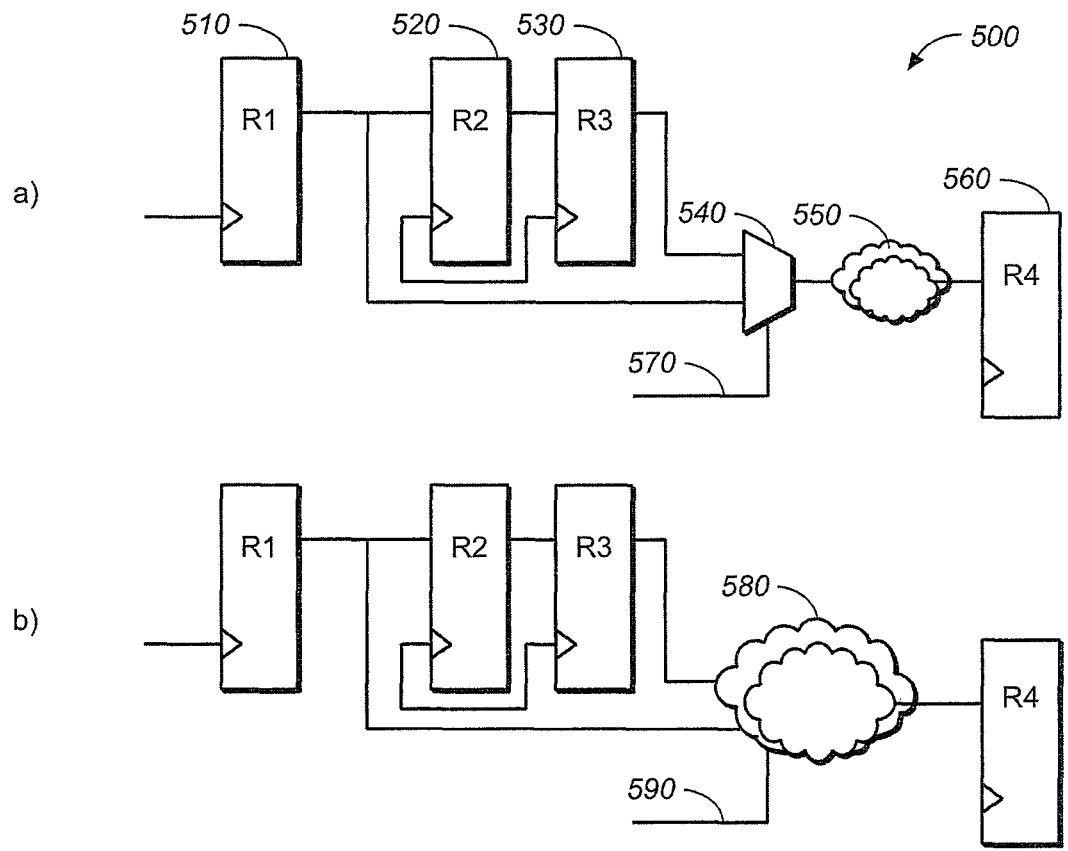
FIG. 5 shows how a multiplexor at the RTL design level can be transformed at the netlist design level.

FIG. 5 shows logic schematics 500 of an RTL design before and after synthesis to a netlist. The RTL design has a multiplexor 540 controlled by select signal 570. The multiplexor 540 has two inputs: a synchronous input that is driven by synchronizing registers 520 and 530, and an asynchronous input that is driven by register 510. Multiplexor 540 drives combinational logic 550 which drives register 560. During RTL verification designers frequently wish to check only one path through a multiplexor. The designers specify a constraint, a set-case-analysis statement, to control the select signal 570 value.

After synthesis to a netlist the multiplexor 540 has been absorbed into combinational logic 580. Potential glitches in the netlist will be masked due to crossings blocked by case analysis. The NCDC accepts an optional parameter, ignore-case-analysis, that tells it to ignore any case analysis constraints.

The embodiments disclosed herein can be implemented as hardware, firmware, software, or any combination thereof. Moreover, the software is preferably implemented as an application program tangibly embodied on a program storage unit or computer readable medium. The application program may be uploaded to, and executed by, a machine comprising any suitable architecture. Preferably, the machine is implemented on a computer platform having hardware such as one or more data processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown. In addition, various other peripheral units may be connected to the computer platform such as an additional data storage unit and a printing unit. Furthermore, a non-transitory computer readable medium is any computer readable medium except for a transitory propagating signal.

What is claimed is:

1. An automated method, implemented as design verification software running on a computer system having a data storage and a processor, for netlist clock domain crossing (CDC) verification, the method comprising:
receiving, by a data storage accessible to a processor, (a) a register-transfer-level (RTL) design of an integrated circuit, together with RTL-level CDC constraints for the RTL design, (b) RTL CDC verification results, and (c) a netlist corresponding to the RTL design;

migrating, by the processor, the RTL-level CDC constraints to netlist CDC constraints and storing the migrated netlist CDC constraints in the data storage;

checking, by the processor, the received netlist for asynchronous clock domain crossings using the migrated netlist CDC constraints to identify correspondences between RTL and netlist level crossings and reporting any CDC violations found in the netlist; and comparing, by the processor, netlist CDC verification results with the received RTL CDC verification results and reporting similarities and differences between the netlist CDC verification results with the received RTL CDC verification results.

2. The method as in claim 1, wherein received RTL-level CDC constraints are those previously provided by a user for sign-off on the RTL CDC verification results.

3. The method as in claim 1, wherein specified netlist constraints are promoted from a lower design hierarchy level to a higher design hierarchy level based on hierarchy in the received RTL design.

4. The method as in claim 1, wherein checking the received netlist comprises any one or more of:
using the migrated constraints to identify synchronized crossings at the netlist;
identifying any additional CDC crossings at the netlist due to lockup latches; and
identifying any glitch violations due to one or more source transitions that are allowed by the netlist CDC constraints.

5. The method as in claim 4, wherein glitch violations are identified using Kung's algebra.

6. The method as in claim 1, wherein the comparing of netlist and RTL CDC verification results reports similarities whenever (1) source and destination of respective crossings are matched exactly in the netlist and RTL design, (2) violation status is the same, and (3) the respective crossings are either both synchronized or both unsynchronized.

7. The method as in claim 1, wherein the comparing of netlist and RTL CDC verification results reports differences whenever one or more of (1) source and destination of respective crossings do not match exactly in the netlist and RTL design, or (2) respective crossings do match exactly but violation status is different, or (3) respective crossings match exactly but said crossings are neither both synchronized nor both unsynchronized.

8. An automated method, implemented as design verification software running on a computer system having a data storage and a processor, for netlist clock domain crossing (CDC) verification, the method comprising:
receiving, by a data storage accessible to a processor, (a) a register-transfer-level (RTL) design of an integrated circuit, together with RTL-level CDC constraints for the RTL design, (b) RTL CDC verification results, and (c) a netlist corresponding to the RTL design;
migrating, by the processor, the RTL-level CDC constraints to netlist CDC constraints and storing the migrated netlist CDC constraints in the data storage, wherein migrating RTL-level CDC constraints to netlist CDC constraints comprises identifying and mapping RTL signal names in the received RTL design to corresponding netlist signal names in the received netlist;
checking, by the processor, the received netlist for asynchronous clock domain crossings using the migrated netlist CDC constraints to identify correspondences between RTL and netlist level crossings and reporting any CDC violations found in the netlist; and
comparing, by the processor, netlist CDC verification results with the received RTL CDC verification results and reporting similarities and differences between the netlist CDC verification results with the received RTL CDC verification results.

9. The method as in claim 8, wherein the identifying and mapping of RTL signal names to netlist signal names comprises applying one or more of (a) change names rules, and bus naming styles used during synthesis of the netlist from the RTL design, and (b) a logic equivalence checking (LEC) mapping file generated during equivalence checking between the RTL design and netlist.

10. An integrated circuit design verification system for performing clock domain crossing (CDC) verification of a netlist corresponding to a register-transfer-level (RTL) design of an integrated circuit, the system comprising a computer processor having access to data storage storing design verification software that, when executed by the computer processor, is operative to:
receive, by the data storage, (a) a register-transfer-level (RTL) design of an integrated circuit, together with RTL-level CDC constraints for the RTL design, (b) RTL CDC verification results, and (c) a netlist corresponding to the RTL design;
migrate, by the processor, the RTL-level CDC constraints to netlist CDC constraints and store the migrated netlist CDC constraints in the data storage;
check, by the processor, the received netlist for asynchronous clock domain crossings using the migrated netlist CDC constraints to identify correspondences between RTL and netlist level crossings and report any CDC violations found in the netlist; and
compare, by the processor, netlist CDC verification results with the received RTL CDC verification results and reporting similarities and differences between the netlist CDC verification results with the received RTL CDC verification results.

11. The system as in claim 10, wherein received RTL-level CDC constraints are those previously provided by a user for sign-off on the RTL CDC verification results.

12. The system as in claim 10, wherein migrating RTL-level CDC constraints to netlist CDC constraints comprises identifying and mapping RTL signal names in the received RTL design to corresponding netlist signal names in the received netlist.

13. The system as in claim 12, wherein the identifying and mapping of RTL signal names to netlist signal names comprises applying one or more of (a) change names rules, and bus naming styles used during synthesis of the netlist from the RTL design, and (b) a logic equivalence checking (LEC) mapping file generated during equivalence checking between the RTL design and netlist.

14. The system as in claim 10, wherein specified netlist constraints are promoted from a lower design hierarchy level to a higher design hierarchy level based on hierarchy in the received RTL design.

15. The system as in claim 10, wherein checking the received netlist comprises any one or more of:
using the migrated constraints to identify synchronized crossings at the netlist;
identifying any additional CDC crossings at the netlist due to lockup latches; and
identifying any glitch violations due to one or more source transitions that are allowed by the netlist CDC constraints.

16. The system as in claim 15, wherein glitch violations are identified using Kung's algebra.

17. The system as in claim 10, wherein the comparing of netlist and RTL CDC verification results reports similarities whenever (1) source and destination of respective crossings are matched exactly in the netlist and RTL design, (2) violation status is the same, and (3) the respective crossings are either both synchronized or both unsynchronized.

18. The system as in claim 10, wherein the comparing of netlist and RTL CDC verification results reports differences whenever one or more of (1) source and destination of respective crossings do not match exactly in the netlist and RTL design, or (2) respective crossings do match exactly but violation status is different, or (3) respective crossings match exactly but said crossings are neither both synchronized nor both unsynchronized.

\* \* \* \* \*